(12) United States Patent
Zheng et al.

(10) Patent No.: US 11,538,825 B2
(45) Date of Patent: Dec. 27, 2022

(54) METHODS FOR FORMING CHANNEL STRUCTURES WITH REDUCED SIDEWALL DAMAGE IN THREE-DIMENSIONAL MEMORY DEVICES

(71) Applicant: YANGTZE MEMORY TECHNOLOGIES CO., LTD., Wuhan (CN)

(72) Inventors: Xiaofen Zheng, Wuhan (CN); Hongbin Zhu, Wuhan (CN); Lixun Gu, Wuhan (CN); Hanwei Yi, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/860,949

(22) Filed: Apr. 28, 2020

(65) Prior Publication Data
US 2021/0257381 A1    Aug. 19, 2021

Related U.S. Application Data

(63) Continuation of application No. PCT/CN2020/075525, filed on Feb. 17, 2020.

(51) Int. Cl.
*H01L 27/11582* (2017.01)
*H01L 27/1157* (2017.01)
*H01L 27/11565* (2017.01)

(52) U.S. Cl.
CPC .... *H01L 27/11582* (2013.01); *H01L 27/1157* (2013.01); *H01L 27/11565* (2013.01)

(58) Field of Classification Search
CPC .................................. H01L 27/115–11597
See application file for complete search history.

(56) References Cited

U.S. PATENT DOCUMENTS 9,876,025 B2     1/2018    Rabkin et al.
2007/0063254 A1*  3/2007    Kim ...................... H01L 27/115
                                              257/315

(Continued)

FOREIGN PATENT DOCUMENTS

CN        105810640 A      7/2016
CN        109417074 A      3/2019

(Continued)

OTHER PUBLICATIONS

International Search Report issued in corresponding International Application No. PCT/CN2020/075525, dated Oct. 27, 2020, 4 pages.

*Primary Examiner* — Didarul A Mazumder
*Assistant Examiner* — Gustavo G Ramallo
(74) *Attorney, Agent, or Firm* — Bayes PLLC

(57) ABSTRACT

Methods for forming channel structures in 3D memory devices are disclosed. In one example, a memory film and a sacrificial layer are subsequently formed along a sidewall and a bottom of a channel hole. A protective structure covering a portion of the sacrificial layer along the sidewall of the channel hole is formed. A portion of the sacrificial layer at the bottom of the channel hole that is not covered by the protective structure is selectively removed. A portion of the memory film at the bottom of the channel hole that is not covered by a remainder of the sacrificial layer is selectively removed.

20 Claims, 15 Drawing Sheets

(56) References Cited

U.S. PATENT DOCUMENTS

| | | | |
|---|---|---|---|
| 2011/0233648 A1* | 9/2011 | Seol | H01L 27/11551 |
| | | | 257/E21.21 |
| 2013/0134492 A1* | 5/2013 | Yang | H01L 27/11582 |
| | | | 257/314 |
| 2015/0076580 A1 | 3/2015 | Pachamuthu et al. | |
| 2015/0318297 A1 | 11/2015 | Hada | |
| 2015/0318302 A1 | 11/2015 | Park et al. | |
| 2016/0204117 A1 | 7/2016 | Liu et al. | |
| 2016/0268276 A1 | 9/2016 | Iino | |
| 2017/0110470 A1* | 4/2017 | Rabkin | H01L 27/11582 |
| 2019/0280001 A1 | 9/2019 | Terasawa et al. | |
| 2019/0355717 A1* | 11/2019 | Zhou | H01L 21/823807 |

FOREIGN PATENT DOCUMENTS

| | | |
|---|---|---|
| CN | 110140211 A | 8/2019 |
| CN | 110690221 A | 1/2020 |
| CN | 110770905 A | 2/2020 |
| TW | I408778 B | 9/2013 |
| TW | I653743 B | 3/2019 |
| TW | I657541 B | 4/2019 |

\* cited by examiner

METHODS FOR FORMING CHANNEL STRUCTURES WITH REDUCED SIDEWALL DAMAGE IN THREE-DIMENSIONAL MEMORY DEVICES

CROSS-REFERENCE TO RELATED APPLICATIONS

This application is continuation of International Application No. PCT/CN2020/075525, filed on Feb. 17, 2020, entitled "METHODS FOR FORMING CHANNEL STRUCTURES IN THREE-DIMENSIONAL MEMORY DEVICES," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of methods for forming channel structures in 3D memory devices.

In one example, a method for forming a 3D memory device is disclosed. A memory film and a sacrificial layer are subsequently formed along a sidewall and a bottom of a channel hole. A protective structure covering a portion of the sacrificial layer along the sidewall of the channel hole is formed. A portion of the sacrificial layer at the bottom of the channel hole that is not covered by the protective structure is selectively removed. A portion of the memory film at the bottom of the channel hole that is not covered by a remainder of the sacrificial layer is selectively removed.

In another example, a method for forming a 3D memory device is disclosed. A memory film and a sacrificial layer are subsequently formed along a sidewall and a bottom of a channel hole. A portion of the sacrificial layer at the bottom of the channel hole is removed to expose a portion of the memory film at the bottom of the channel hole. The portion of the memory film at the bottom of the channel hole that is not covered by a remainder of the sacrificial layer is wet etched.

In still another example, a method for forming a 3D memory device is disclosed. A memory film and a sacrificial layer are subsequently formed along a sidewall and a bottom of a channel hole. A protective structure covering a portion of the sacrificial layer along the sidewall of the channel hole is formed. A portion of the sacrificial layer at the bottom of the channel hole that is not covered by the protective structure is wet etched. A portion of the memory film at the bottom of the channel hole that is not covered by a remainder of the sacrificial layer is wet etched.

In yet another example, a 3D memory device includes a substrate, a memory stack including interleaved conductive layers and dielectric layers above the substrate, and a channel structure extending vertically through the memory stack. The channel structure includes a semiconductor plug in a lower portion of the channel structure, a memory film above the semiconductor plug and along a sidewall of the channel structure, and a semiconductor channel over the memory film. A bottom of the semiconductor channel is above and in contact with the semiconductor plug.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
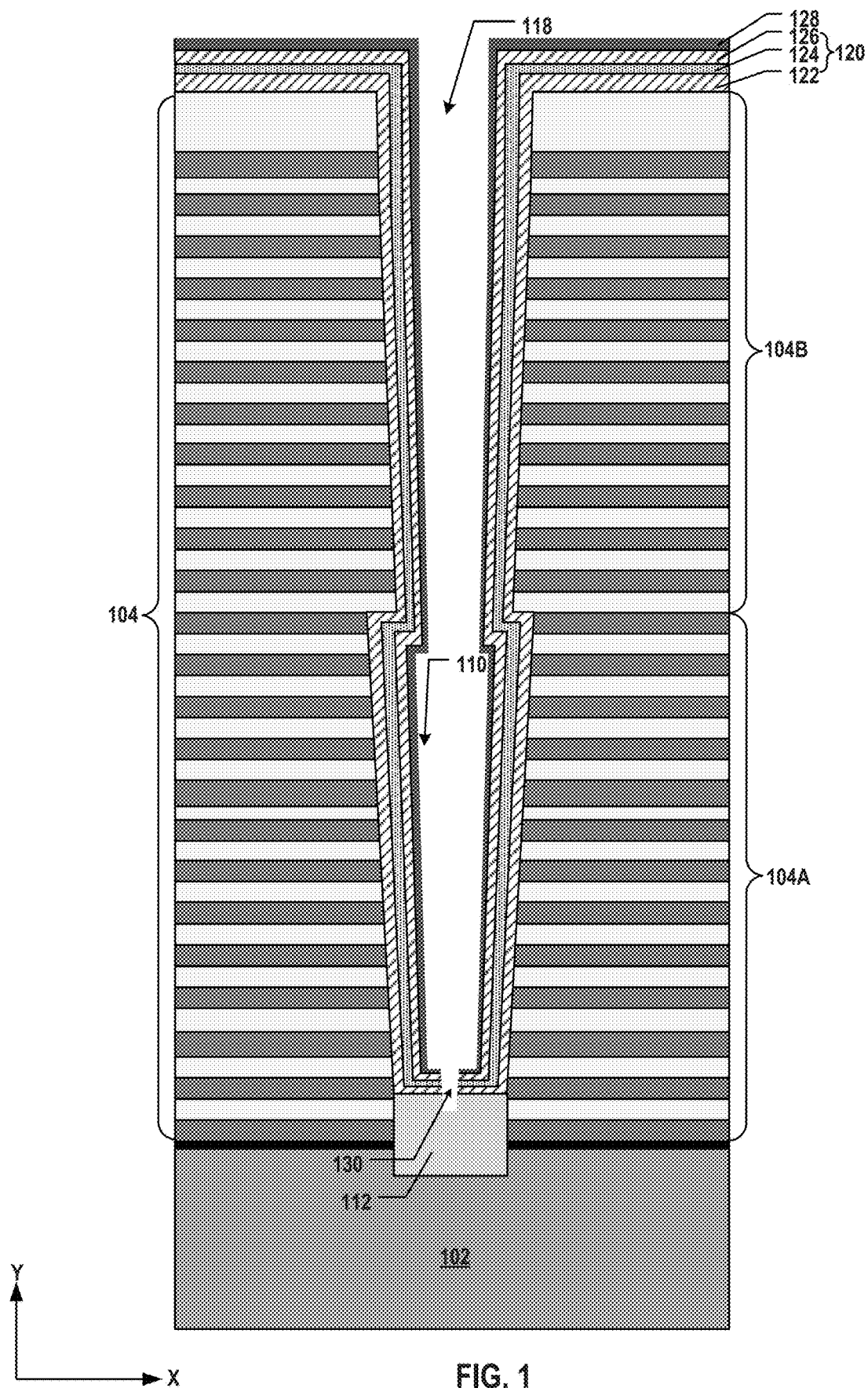
FIG. 1 illustrates a cross-section of an intermediate structure in forming a 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a semiconductor plug is typically formed at one end of a NAND memory string. The semiconductor plug acts as a channel of a transistor when combined with a gate conductor layer formed surrounding it. In fabricating 3D NAND memory devices with advanced technologies, such as having 96 or more levels, a dual-deck architecture is usually used, which requires a sacrificial layer (e.g., having polysilicon) that is formed over the memory film along the sidewall and the bottom of the channel hole for performing the so-called "SONO punch" process.

For example, FIG. 1 illustrates a cross-section of an intermediate structure in forming a 3D memory device. The intermediate structure shown in FIG. 1 is at a fabrication stage for forming a channel structure extending vertically through a dual-deck dielectric stack 104 including a lower dielectric deck 104A and an upper dielectric deck 104B above a substrate 102. An upper channel hole 118 and a lower channel hole 110 can be formed through upper dielectric deck 104B and lower dielectric deck 104A, respectively, in which the channel structure can be formed. As shown in FIG. 1, the intermediate structure also includes a semiconductor plug 112 at the lower end of lower channel hole 110. A memory film 120 including a block layer 122, a storage layer 124 (also known as a "charge trap layer"), and a tunnel layer 126 is formed along the sidewalls of upper and lower channel holes 118 and 110 as well as the bottom of lower channel hole 110. A sacrificial layer 128 (e.g., having polysilicon) is formed over tunnel layer 126 of memory film 120.

In order to make an electrical connection between semiconductor plug 112 and the semiconductor channel to be formed after the removal of sacrificial layer 128, an opening 130 is formed through memory film 120 and sacrificial layer 128 at the bottom of lower channel hole 110 using a dry etching technique (e.g., a multiple cycles of plasma-assisted dry etching processes), which is known as the SONO punch" as the dry etching punches opening 130 through composite layers of Silicon (in sacrificial layer 128), silicon Oxide (in tunnel layer 126), silicon Nitride (in storage layer 124), and silicon Oxide (in block layer 122). Opening 130 formed by the "SONO punch" process extends further into semiconductor plug 112 to ensure that a portion of memory film 120 at the bottom of lower channel hole 110 is completely removed to expose semiconductor plug 112 as it is difficult to stop the plasma-assisted dry etching process at the top surface of semiconductor plug 112. As a result, the bottom of opening 130 is below the top surface of semiconductor plug 112 after the "SONO punch" process, as shown in FIG. 1.

Using the "SONO punch" process to form opening 130 through memory film 120, however, can cause various issues. For example, when the overlay between upper channel hole 118 and lower channel hole 110 shifts (e.g., due to the misalignment when forming upper channel hole 118), the plasma-assisted dry etching can easily damage sacrificial layer 128 and memory film 120 underneath along the sidewall of lower channel hole 110. Moreover, since opening 130 formed by the "SONO punch" process extends further into semiconductor plug 112, the resulting "L"-foot need to be removed to increase the channel current passing through the semiconductor channel to be formed and semiconductor plug 112 in the final 3D memory device. The gouging variation among a large number of channel structures further reduces the process yield in removing the "L"-foot.

Various embodiments in accordance with the present disclosure provide improved methods for forming channel structures in 3D memory devices with less damage to the memory film and smaller or even no gouging in the semiconductor plug, thereby improving the product yield of the 3D memory devices. In some embodiments, a protective structure is formed to cover a portion of the sacrificial layer along the sidewall of the channel hole to reduce sidewall damage to the memory film underneath. In some embodiments, wet etching processes with high selectivity are used to replace the plasma-assisted dry etching processes in the "SONO punch" process for forming the opening through the memory film, which further reduces the sidewall damage and the gouging into the semiconductor plug.

Figure 2:
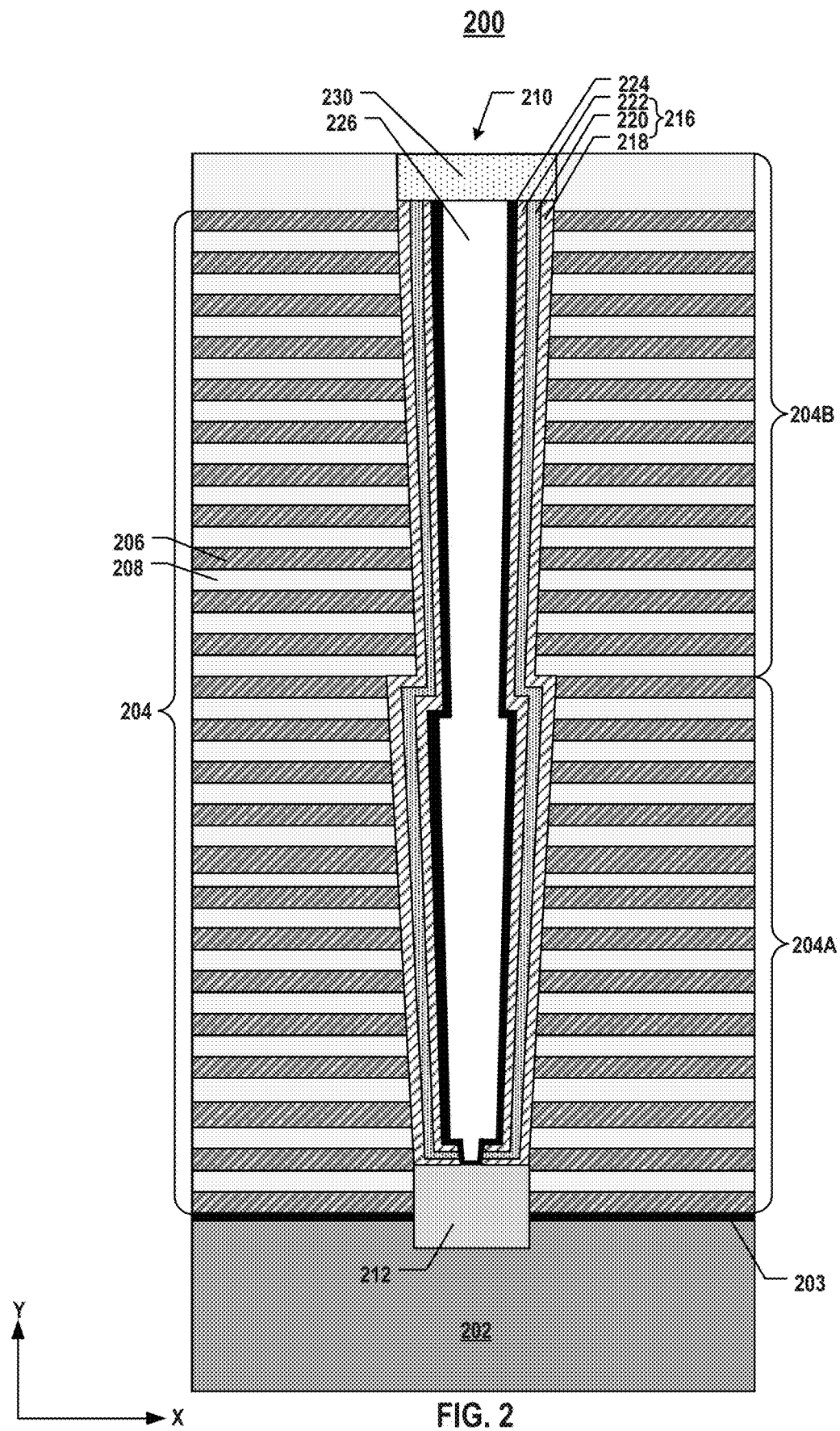
FIG. 2 illustrates a cross-section of an exemplary 3D memory device having a channel structure, according to some embodiments of the present disclosure.

FIG. 2 illustrates a cross-section of an exemplary 3D memory device 200 having a channel structure 210, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which was thinned by grinding, etching, chemical mechanical polishing (CMP), or any combination thereof. It is noted that x and y axes are included in FIG. 2 to further illustrate the spatial relationship of the components in 3D memory device 200. Substrate 202 of 3D memory device 200 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 200) is determined relative to the substrate of the 3D memory device (e.g., substrate 202) in the y-direction (i.e., the vertical direction) when the substrate is positioned in the lowest plane of the 3D memory device in the y-direction. The same notion for describing the spatial relationships is applied throughout the present disclosure.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or are to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 202) remains as the substrate of the bonded non-monolithic 3D memory device, and the peripheral device (e.g., including any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate (e.g., substrate 202) is flipped and faces down toward the peripheral device (not shown) for hybrid bonding, so that in the bonded non-monolithic 3D memory device, the memory array device is above the peripheral device. The memory array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 200 is a NAND Flash memory device in which memory cells are provided in the form of an array of NAND memory strings extending vertically above substrate 202. Each NAND memory string can include channel structure 210 that extends vertically through a plurality of pairs each including a conductive layer 206 and a dielectric layer 208 (referred to herein as "conductive/dielectric layer pairs"). The stacked conductive/dielectric layer pairs are also referred to herein as a "memory stack" 204. In some embodiments, an insulation layer 203, such as a silicon oxide layer, is formed between substrate 202 and memory stack 204. The number of the conductive/dielectric layer pairs in memory stack 204 (e.g., 32, 64, 96, or 128) determines the number of memory cells in 3D memory device 200. Memory stack 204 can include a plurality of interleaved conductive layers 206 and dielectric layers 208. Conductive layers 206 and dielectric layers 208 in memory stack 204 can alternate in the vertical direction. Conductive layers 206 can include conductive materials including, but not limited to, tungsten (W), cobalt (Co), copper (Cu), aluminum (Al), polysilicon, doped silicon, silicides, or any combination thereof. Dielectric layers 208 can include dielectric materials including, but not limited to, silicon oxide, silicon nitride, silicon oxynitride, or any combination thereof. In some embodiments, memory stack 204 has a dual-deck architecture, which includes a lower memory deck 204A and an upper memory deck 204B on lower memory deck 204A. The numbers of conductive/dielectric layer pairs in each of lower and upper memory decks 204A and 204B can be the same or different.

As shown in FIG. 2, channel structure 210 can extend vertically through memory stack 204 and include a channel hole filled with semiconductor material(s) (e.g., as a semiconductor channel 224) and dielectric material(s) (e.g., as a memory film 216). In some embodiments, semiconductor channel 224 includes silicon, such as amorphous silicon, polysilicon, or single crystalline silicon. In some embodiments, memory film 216 is a composite layer including a tunnel layer 222, a storage layer 220 (also known as a "charge trap layer"), and a block layer 218. The remaining space of channel structure 210 can be partially or fully filled with a filling layer 226 including dielectric materials, such as silicon oxide. Channel structure 210 can have a cylinder shape (e.g., a pillar shape). Filling layer 226, semiconductor channel 224, tunnel layer 222, storage layer 220, and block layer 218 are arranged radially from the center toward the outer surface of the pillar in this order, according to some embodiments. Tunnel layer 222 can include silicon oxide, silicon oxynitride, or any combination thereof. Storage layer 220 can include silicon nitride, silicon oxynitride, silicon, or any combination thereof. Block layer 218 can include silicon oxide, silicon oxynitride, high dielectric constant (high-k) dielectrics, or any combination thereof. In one example, memory film 216 can include a composite layer of silicon oxide/silicon oxynitride/silicon oxide (ONO).

In some embodiments, conductive layer 206 (which can be part of a word line) in memory stack 204 functions as a gate conductor of memory cells in the NAND memory strings. Conductive layer 206 can include multiple control gates of multiple NAND memory cells and can extend laterally as a word line ending at the edge of memory stack 204 (e.g., in a staircase structure of memory stack 204). In some embodiments, memory cell transistors in the NAND memory strings include gate conductors (i.e., parts of conductive layers 206 that abut channel structure 210) made from W, adhesion layers (not shown) including titanium/titanium nitride (Ti/TiN) or tantalum/tantalum nitride (Ta/TaN), gate dielectric layers (not shown) made from high-k dielectric materials, and semiconductor channel 224 including polysilicon.

In some embodiments, channel structure 210 further includes semiconductor plug 212 in a lower portion (e.g., at the lower end) of channel structure 210. As used herein, the "upper end" of a component (e.g., channel structure 210) is the end farther away from substrate 202 in the y-direction, and the "lower end" of the component (e.g., channel structure 210) is the end closer to substrate 202 in the y-direction when substrate 202 is positioned in the lowest plane of 3D memory device 200. Semiconductor plug 212 can include a semiconductor material, such as silicon, which is epitaxially grown from substrate 202 in any suitable directions. It is understood that in some embodiments, semiconductor plug 212 includes single crystalline silicon, the same material of substrate 202. In other words, semiconductor plug 212 can include an epitaxially-grown semiconductor layer that is the same as the material of substrate 202. Semiconductor plug 212 can function as a channel controlled by a source select gate of the NAND memory string.

In some embodiments, channel structure 210 further includes a channel plug 230 in an upper portion (e.g., at the upper end) of channel structure 210. Channel plug 230 can be in contact with the upper end of semiconductor channel 224. Channel plug 230 can include semiconductor materials (e.g., polysilicon). By covering the upper end of channel structure 210 during the fabrication of 3D memory device 200, channel plug 230 can function as an etch stop layer to prevent etching of dielectrics filled in channel structure 210, such as silicon oxide and silicon nitride. In some embodiments, channel plug 230 also functions as the drain of the NAND memory string.

As shown in FIG. 2, memory film 216 is above semiconductor plug 212 and along the sidewall of channel structure 210, and semiconductor channel 224 is over memory film 216, according to some embodiments. In some embodiments, the bottom of semiconductor channel 224 is above and in contact with semiconductor plug 212 to avoid the gouging into semiconductor plug 212 as described above with respect to FIG. 1. That is, the opening extending through a portion of memory film 216 at the bottom of channel structure 210 does not extend further into semiconductor plug 212, but instead, stops at the upper surface of semiconductor plug 212, according to some embodiments. Semiconductor channel 224 can fill along at least the sidewall and the bottom of the opening to contact the upper surface of semiconductor plug 212. By minimizing the gouging into semiconductor plug 212 in each channel structure 210, the product yield can be increased and the electrical performance of 3D memory device 200 can be improved. The formation of channel structure 210 of 3D memory device 200 with minimized gouging into semiconductor plug 212 is described below in detail.

FIGS. 3A-3G illustrate an exemplary fabrication process for forming a 3D memory device having a channel structure, according to some embodiments of the present disclosure. FIGS. 4A and 4B illustrate a flowchart of an exemplary method 400 for forming a 3D memory device having a channel structure, according to some embodiments of the present disclosure. FIGS. 5A-5H illustrate an enlarged view of an exemplary fabrication process for forming an intermediate structure shown in FIG. 3F, according to some embodiments of the present disclosure. Examples of the semiconductor devices depicted in FIGS. 3A-3G, 4A, 4B, and 5A-5H include 3D memory device 200 depicted in FIG. 2. It is understood that the operations shown in method 400 are not exhaustive and that other operations can be performed as well before, after, or between any of the illustrated operations. Further, some of the operations may be performed simultaneously, or in a different order than shown in FIGS. 4A and 4B.

Referring to FIG. 4A, method 400 starts at operation 402, in which a semiconductor plug is formed at a bottom of a channel hole. In some embodiments, the semiconductor plug is an epitaxially-grown silicon plug. In some embodiments, the channel hole including a first opening and a second opening on the first opening is formed through a dielectric stack including a first dielectric deck and a second dielectric deck on the first dielectric deck. The first dielectric deck can be formed above a substrate. The substrate can be a silicon substrate. The first dielectric deck can include a first plurality of interleaved sacrificial layers and dielectric layers.

Figure 3A:
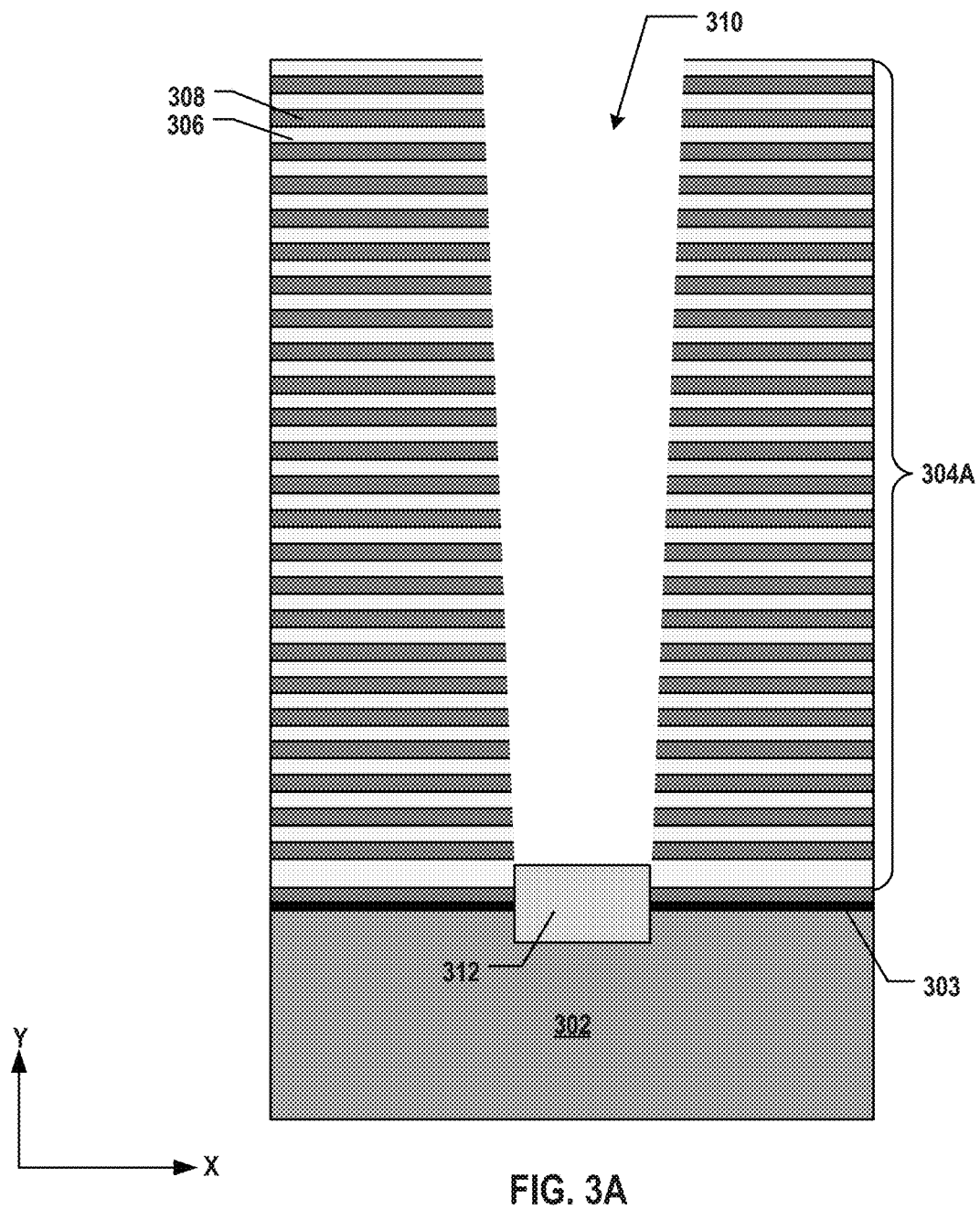
FIGS. 3A-3G illustrate an exemplary fabrication process for forming a 3D memory device having a channel structure, according to some embodiments of the present disclosure.
Figure 4A:
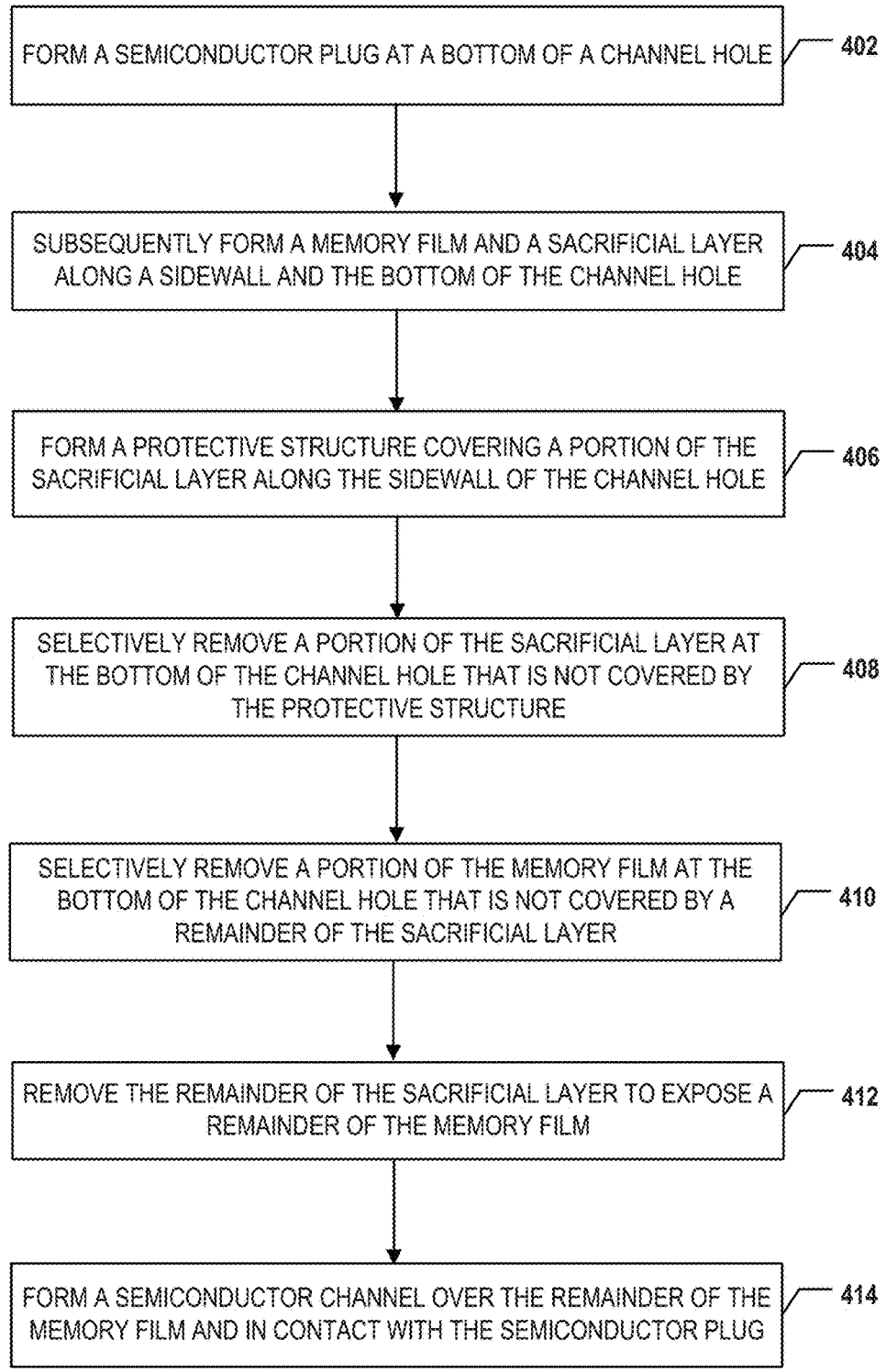
FIGS. 4A and 4B illustrate a flowchart of an exemplary method for forming a 3D memory device having a channel structure, according to some embodiments of the present disclosure.
Figure 4B:
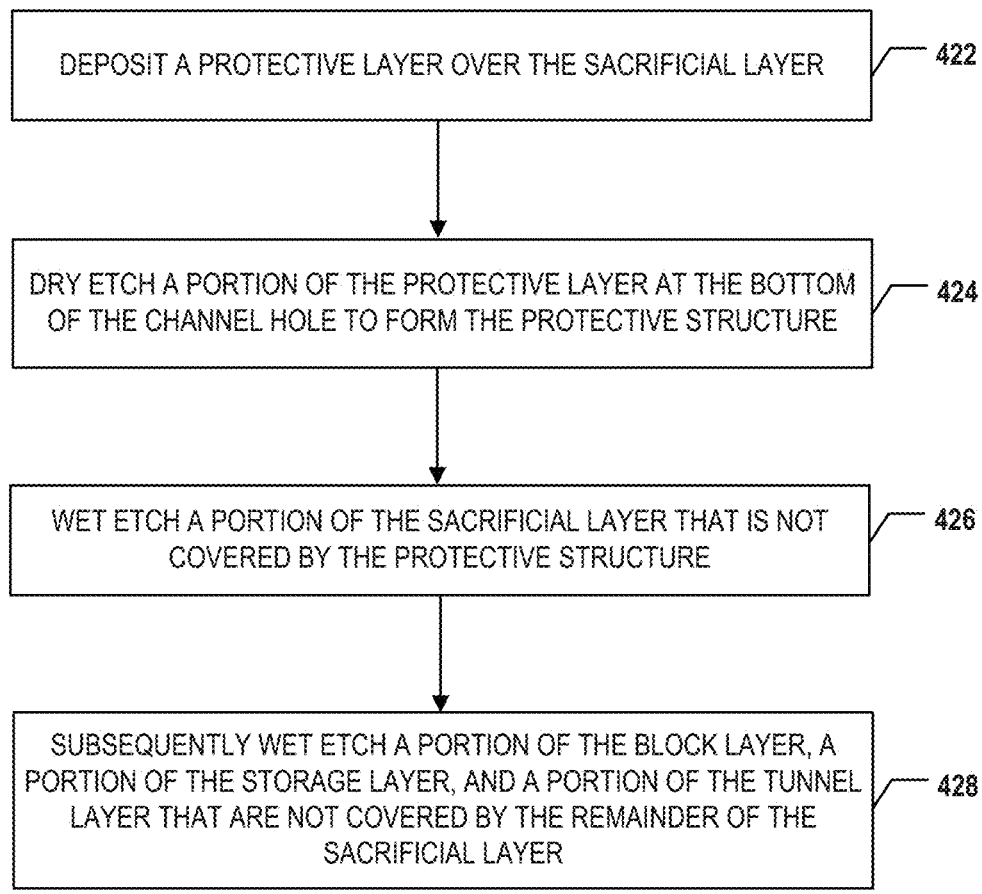

As illustrated in FIG. 3A, a lower dielectric deck 304A including a plurality pairs of a first dielectric layer 306 and a second dielectric layer (known as a "sacrificial layer") 308 (together referred to herein as "dielectric layer pairs") is formed above a silicon substrate 302. In some embodiments, an insulation layer 303 is formed between lower dielectric deck 304A and silicon substrate 302 by depositing dielectric materials, such as silicon oxide, or thermal oxidation, on silicon substrate 302 prior to the formation of lower dielectric deck 304A. Lower dielectric deck 304A includes interleaved sacrificial layers 308 and dielectric layers 306, according to some embodiments. Dielectric layers 306 and sacrificial layers 308 can be alternatively deposited on silicon substrate 302 to form lower dielectric deck 304A. In some embodiments, each dielectric layer 306 includes a layer of silicon oxide, and each sacrificial layer 308 includes a layer of silicon nitride. Lower dielectric deck 304A can be formed by one or more thin film deposition processes including, but not limited to, CVD, PVD, ALD, or any combination thereof.

The first opening can be formed extending vertically through the first dielectric deck. As illustrated in FIG. 3A, a lower channel hole 310 is an opening formed extending vertically through lower dielectric deck 304A. In some embodiments, fabrication processes for forming lower channel hole 310 include wet etching and/or dry etching, such as deep reactive-ion etching (DRIE). In some embodiments, lower channel hole 310 extends further into silicon substrate 302. The etching process through lower dielectric deck 304A may not stop at the top surface of silicon substrate 302 and may continue to etch part of silicon substrate 302. In some embodiments, a separate etching process is used to etch part of silicon substrate 302 after etching through lower dielectric deck 304A.

A semiconductor plug can be formed in the lower portion of the first opening. As illustrated in FIG. 3A, a silicon plug 312 can be formed by filling the lower portion of lower channel hole 310 with single crystalline silicon epitaxially grown from silicon substrate 302 in any suitable directions (e.g., from bottom surface and/or side surface). The fabrication processes for epitaxially growing silicon plug 312 can include, but is not limited to, vapor-phase epitaxy (VPE), liquid-phase epitaxy (LPE), molecular-beam epitaxy (MPE), or any combinations thereof.

Figure 3B:
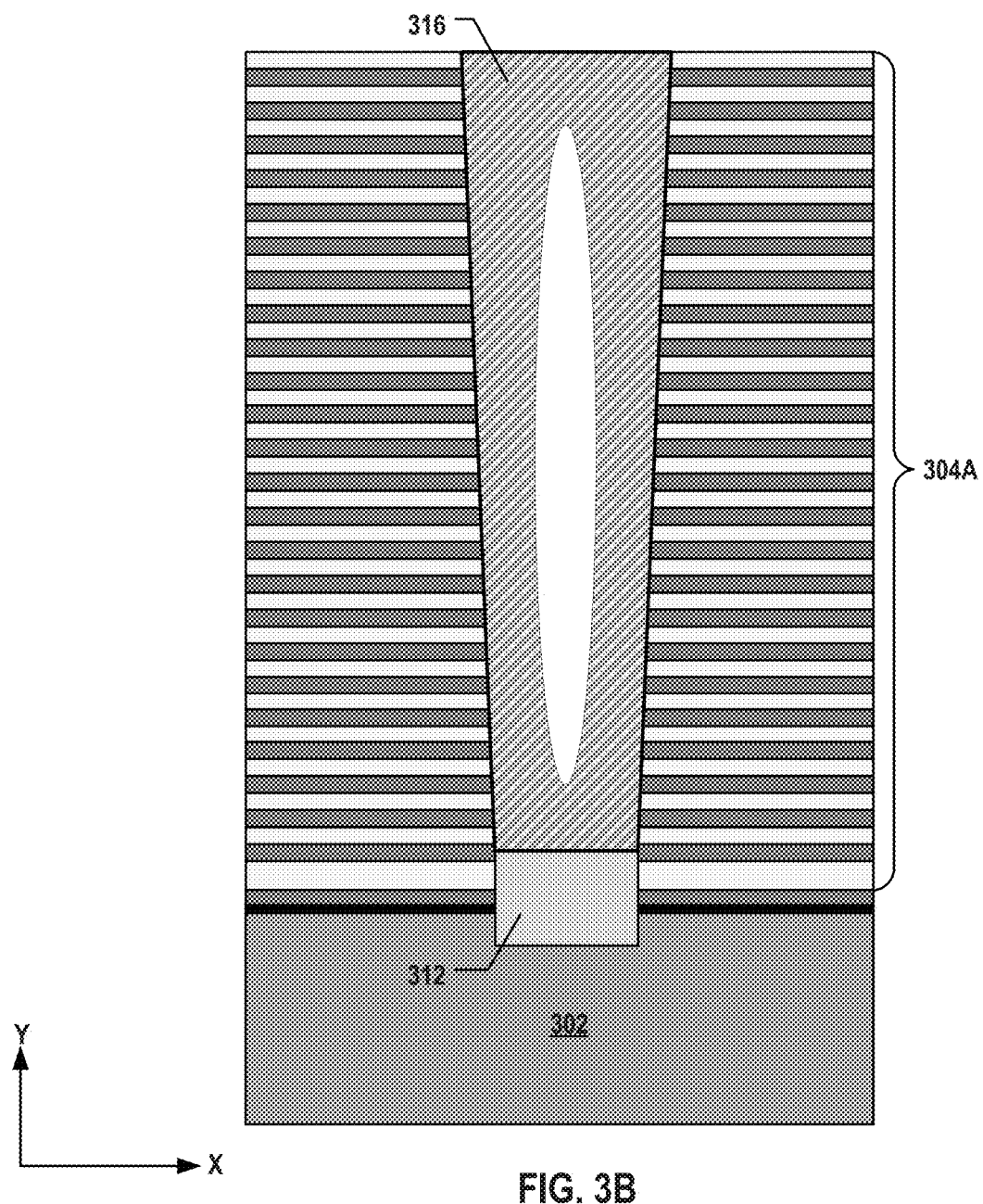

A sacrificial layer can be formed on the semiconductor plug. As illustrated in FIG. 3B, a sacrificial layer 316 is deposited using one or more thin film deposition processes, such as PVD, CVD, ALD, electroplating, electroless plating, or any combinations thereof, to partially or fully fill lower channel hole 310 (shown in FIG. 3A). Sacrificial layer 316 can include any suitable material that is to be removed in a later process, such as polysilicon.

Figure 3C:
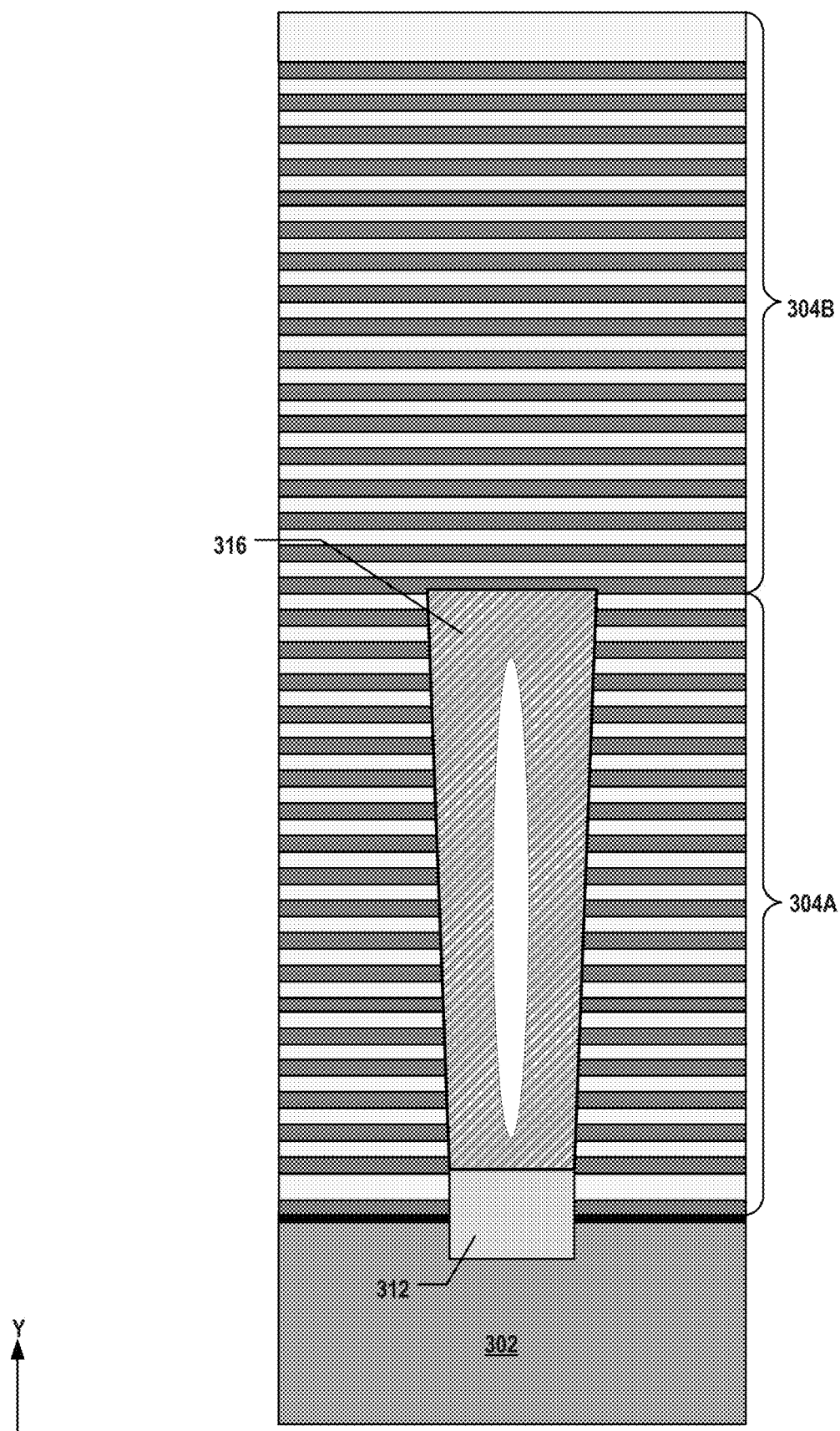

The second dielectric deck can be formed on the first dielectric deck. Similar to the first dielectric deck, the second dielectric deck can include a second plurality of interleaved sacrificial layers and dielectric layers. As illustrated in FIG. 3C, an upper dielectric deck 304B including a plurality of dielectric layer pairs is formed on lower dielectric deck 304A. Upper dielectric deck 304B can be formed by one or more thin film deposition processes including, but not limited to, CVD, PVD, ALD, or any combination thereof.

Figure 3D:
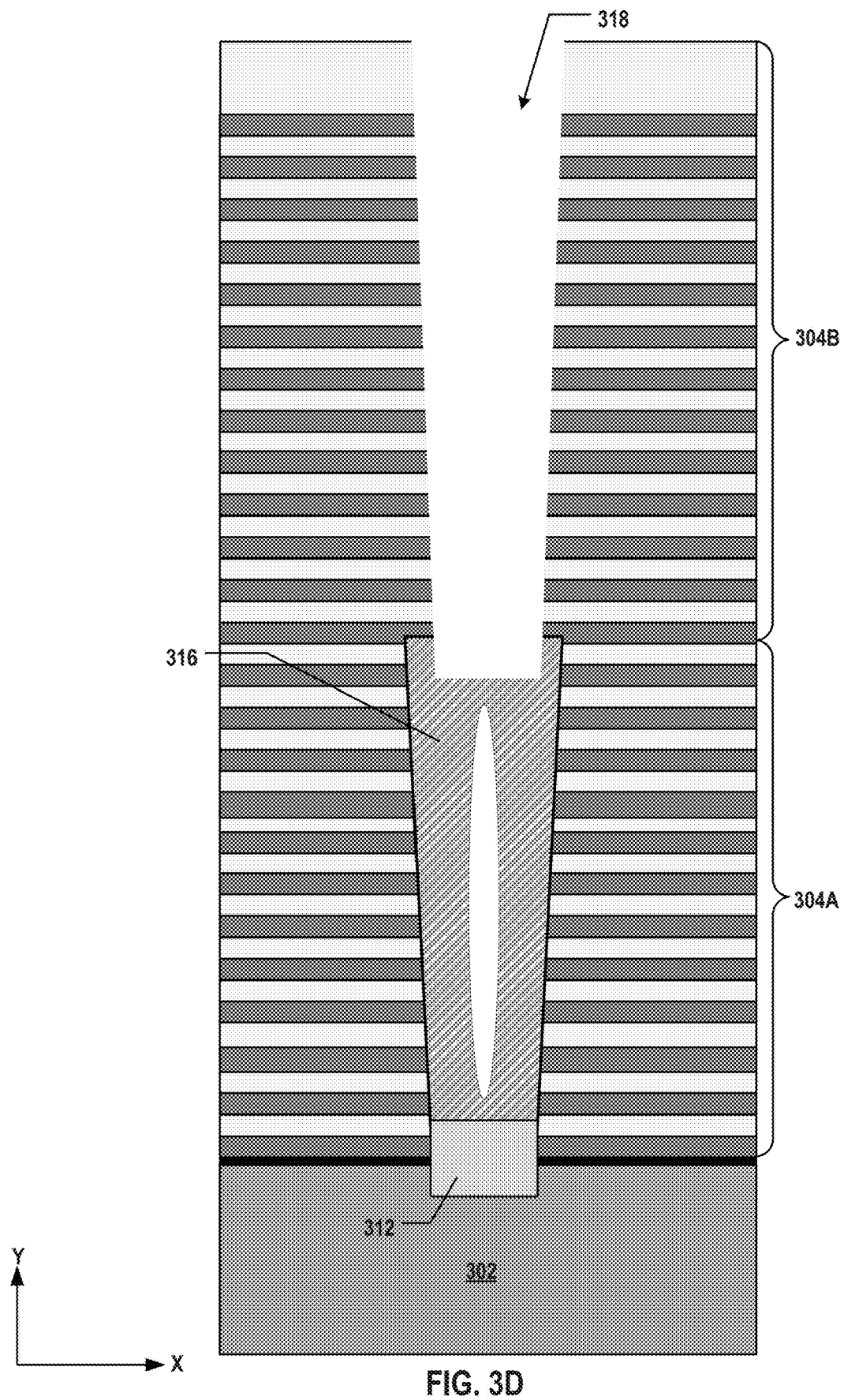

The second opening can then be formed extending vertically through the second dielectric deck to expose the sacrificial layer. As illustrated in FIG. 3D, an upper channel hole 318 is another opening formed extending vertically through upper dielectric deck 304B to expose sacrificial layer 316. Upper channel hole 318 can be aligned with lower channel hole 310 (shown in FIG. 3E) so as to expose at least part of sacrificial layer 316. Upper and lower channel holes 318 and 310 can be connected after sacrificial layer 316 is removed. In some embodiments, fabrication processes for forming upper channel hole 318 include wet etching and/or dry etching, such as DRIE. In some embodiments, upper channel hole 318 extends into part of sacrificial layer 316. The etching process through upper dielectric deck 304B may not stop at the top surface of sacrificial layer 316 but continue to etch part of sacrificial layer 316. In some embodiments, a separate etching process is used to etch part of sacrificial layer 316 after etching upper dielectric deck 304B.

Figure 3E:
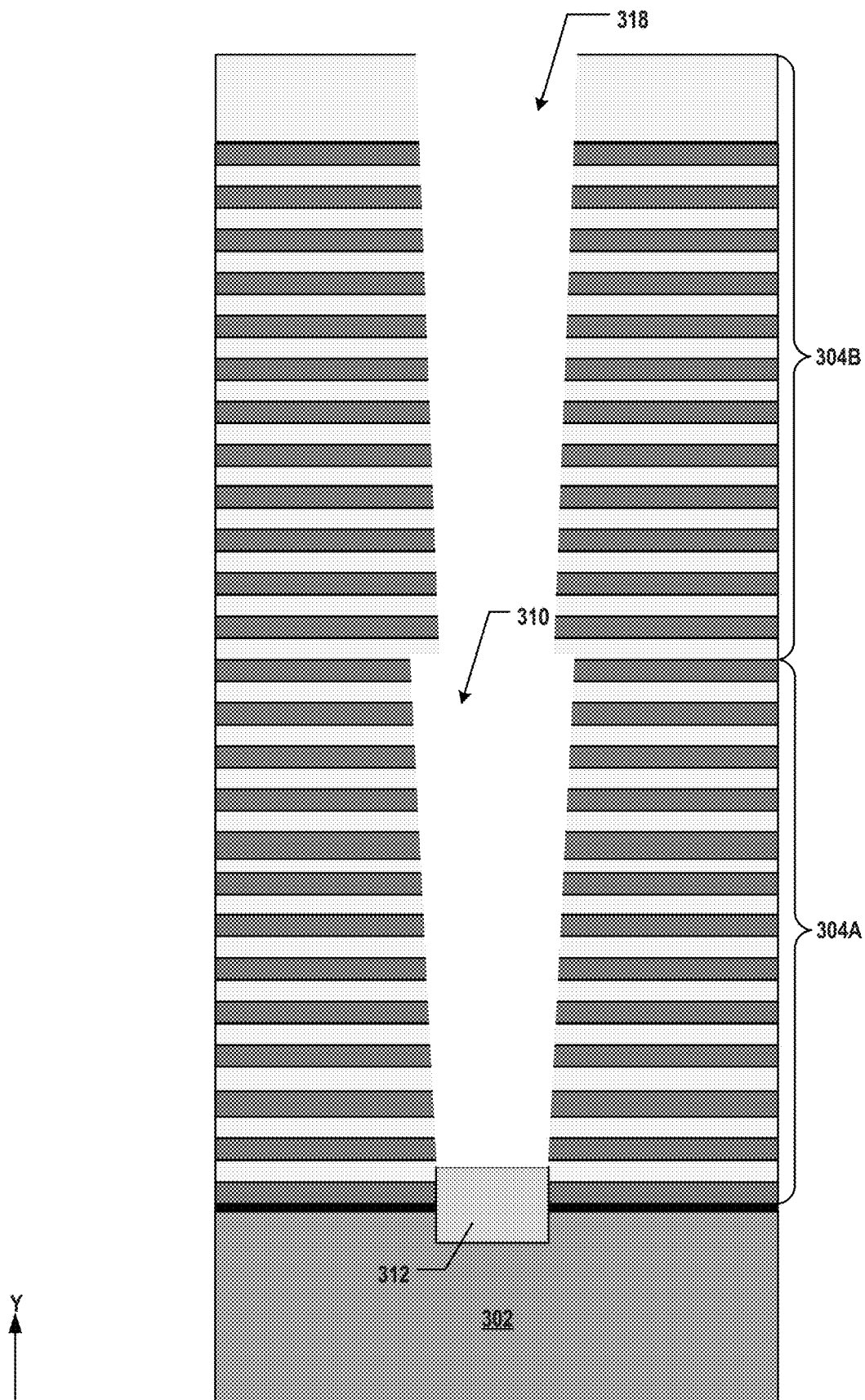

The sacrificial layer can then be removed. In some embodiments, the sacrificial layer is etched to expose the semiconductor plug. As illustrated in FIG. 3E, sacrificial layer 316 (shown in FIG. 3D) is removed in lower dielectric deck 304A by wet etching and/or dry etching to expose silicon plug 312. After the removal of sacrificial layer 316, lower channel hole 310 becomes open again and connected with upper channel hole 318, as shown in FIG. 3E. Silicon plug 312 is thereby formed at the bottom of a channel hole including lower channel hole 310 and upper channel hole 318, according to some embodiments.

Method 400 proceeds to operation 404, as illustrated in FIG. 4A, in which a memory film and a sacrificial layer are subsequently formed along a sidewall and the bottom of the channel hole. In some embodiments, to subsequently form the memory film and the sacrificial layer, a block layer, a storage layer, and a tunnel layer are subsequently deposited along the sidewall and the bottom of the channel hole, and the sacrificial layer is deposited over the tunnel layer. In some embodiments, the block layer includes silicon oxide, the storage layer includes silicon nitride, the tunnel layer includes silicon oxide, and the sacrificial layer includes polysilicon.

Figure 3F:
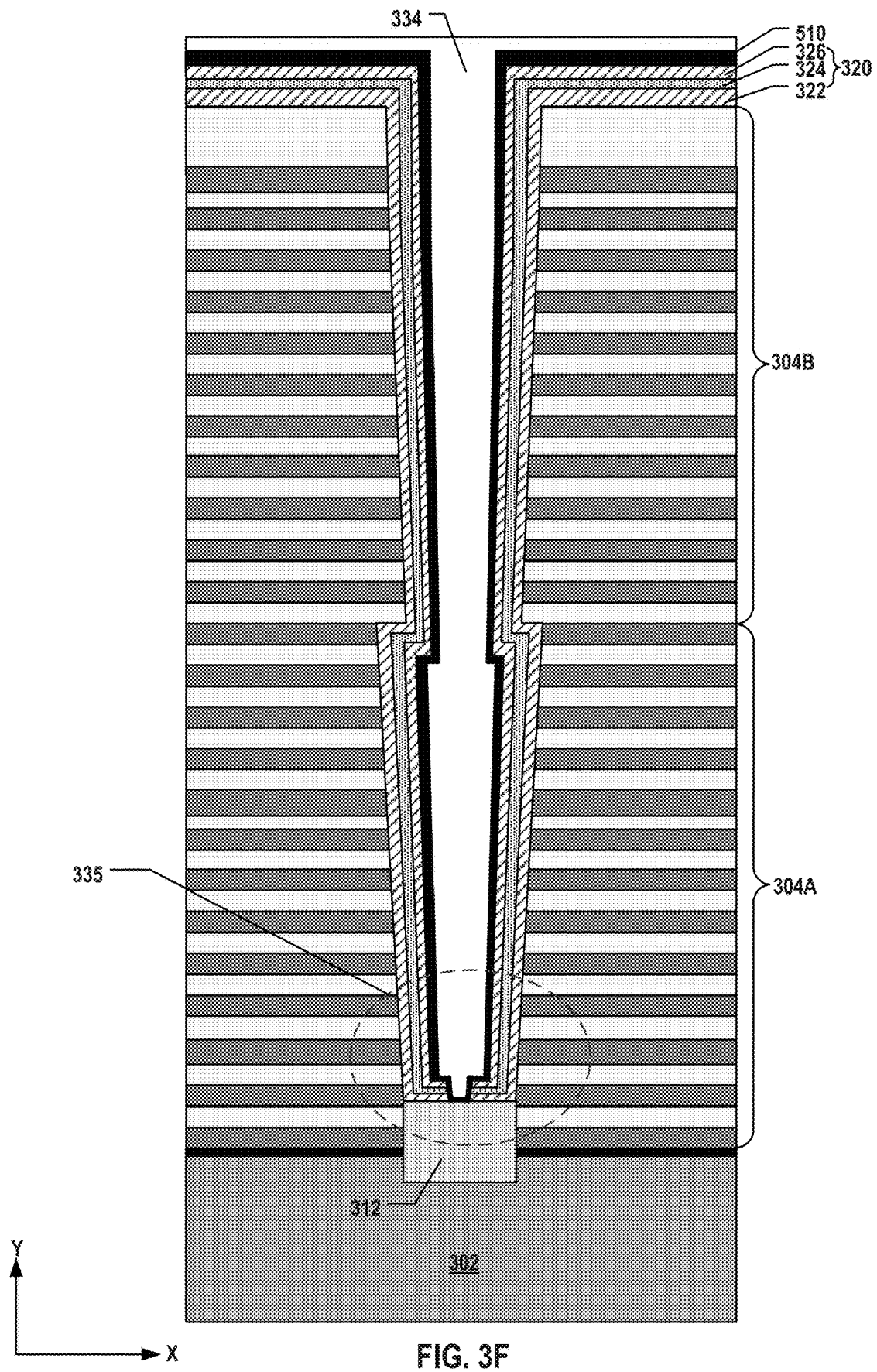
Figure 5A:
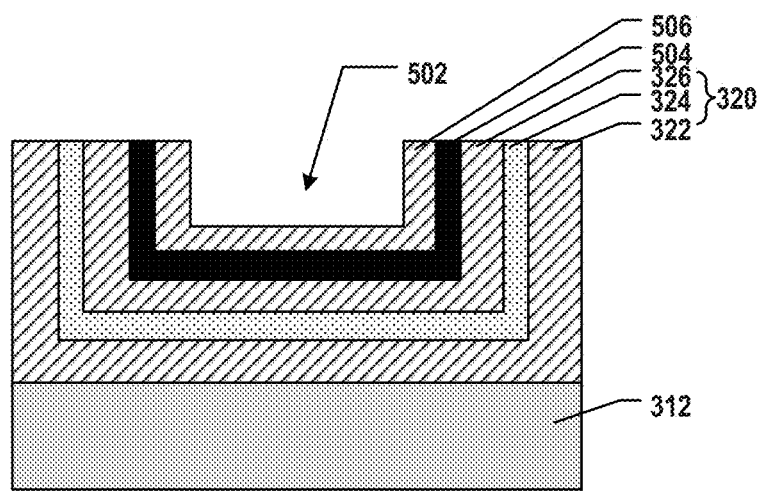
FIGS. 5A-5H illustrate an enlarged view of an exemplary fabrication process for forming an intermediate structure shown in FIG. 3F, according to some embodiments of the present disclosure.

As illustrated in FIG. 3F, a memory film 320 (including a block layer 322, a storage layer 324, and a tunnel layer 326) above silicon plug 312 is formed along the sidewall of lower and upper channel holes 310 and 318. FIGS. 5A-5H illustrate an enlarged view of an exemplary fabrication process for forming the intermediate structure shown in FIG. 3F, specifically an area 335 including the bottom of the channel structure, according to some embodiments of the present disclosure. As illustrated in FIG. 5A, block layer 322, storage layer 324, and tunnel layer 326 are subsequently deposited along the sidewall and the bottom of a channel hole 502 (e.g., including lower and upper channel holes 310 and 318) to form memory film 320, according to some embodiments. A sacrificial layer 504 can then be deposited over tunnel layer 326 along the sidewall and the bottom of channel hole 502. Block layer 322, storage layer 324, tunnel layer 326, and sacrificial layer 504 can be subsequently deposited in this order using one or more thin film deposition processes, such as ALD, CVD, PVD, any other suitable processes, or any combination thereof. Memory film 320 and sacrificial layer 504 can cover both the bottom (on silicon plug 312) and the sidewall of channel hole 502. In some embodiments, a silicon oxide layer, a silicon nitride layer, a silicon oxide layer, and a polysilicon layer (a "SONO" structure) are subsequently deposited to form memory film 320 and sacrificial layer 504.

Method 400 proceeds to operation 406, as illustrated in FIG. 4A, in which a protective structure covering a portion of the sacrificial layer along the sidewall of the channel hole is formed. Different from the existing methods for forming channel structures in a 3D memory device, for example, as shown in FIG. 1, an additional process for forming a protective structure covering part of the sacrificial layer along the sidewall of the channel hole is included in method 400 prior to etching the sacrificial layer and memory film underneath at the bottom of the channel hole so as to protect the sacrificial layer and memory film from sidewall damage due to the overlay shift between the upper channel hole and lower channel hole. In some embodiments as shown in FIG. 4B, to form the protective structure, a protective layer is deposited over the sacrificial layer in operation 422, and a portion of the protective layer at the bottom of the channel hole is etched (e.g., using dry etching) to form the protective structure in operation 424. The protective layer and the sacrificial layer can include different materials. In some embodiments, the sacrificial layer includes polysilicon, and the protective layer includes a dielectric material, such as silicon oxide or silicon nitride.

Figure 5B:
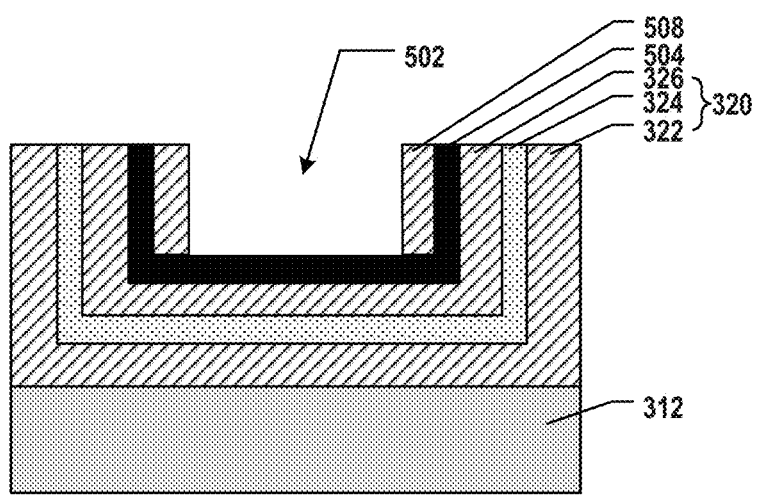

As illustrated in FIG. 5A, a protective layer 506 is formed over sacrificial layer 504 along the sidewall and the bottom of channel hole 502. Protective layer 506 can be formed by depositing a dielectric material, such as silicon oxide or silicon nitride, using one or more thin film deposition processes, such as ALD, CVD, PVD, any other suitable processes, or any combination thereof, to cover sacrificial layer 504. As illustrated in FIG. 5B, a portion of protective layer 506 (shown in FIG. 5A) at the bottom of channel hole 502 is etched to form a protective structure 508. In some embodiments, part of protective layer 506 that is at the bottom of channel hole 502 is removed using a dry etching process, such as RIE or any other plasma-assisted dry etching processes. Examples of suitable gasses for the plasma include fluorocarbons, oxygen, chlorine, and boron trichloride. As the dry etching process typically etches directionally or anisotropically, only part of protective layer 506 that is at the bottom of channel hole 502 may be removed, leaving other parts of protective layer 506 that is along the sidewall of channel hole 502 intact. Protective structure 508 covering a portion of sacrificial layer 504 along the sidewall of channel hole 502 is thereby formed, according to some embodiments.

Method 400 proceeds to operation 408, as illustrated in FIG. 4A, in which a portion of the sacrificial layer at the bottom of the channel hole that is not covered by the protective structure is selectively removed to expose a portion of the memory film at the bottom of the channel hole. In some embodiments as shown in FIG. 4B, the portion of the sacrificial layer that is not covered by the protective structure is wet etched in operation 426. It is understood that in some embodiments, the portion of the sacrificial layer may be removed by dry etching.

Figure 5C:
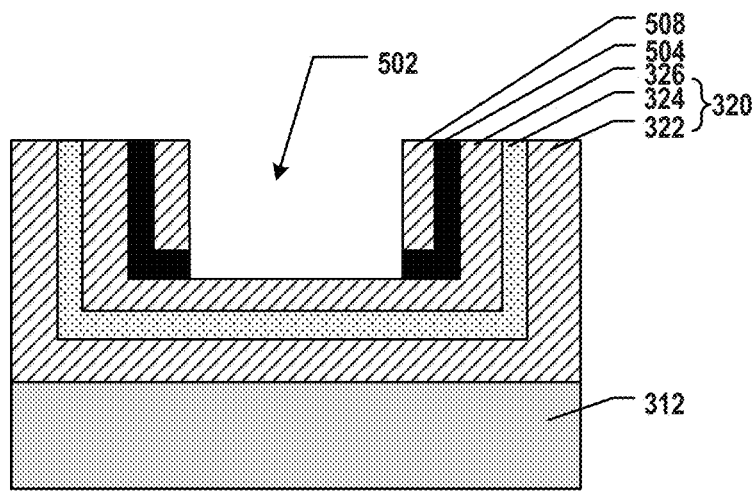

As illustrated in FIG. 5C, a portion of sacrificial layer 504 at the bottom of channel hole 502 that is not covered by protective structure 508 is removed to expose a portion of tunnel layer 326 of memory film 320 at the bottom of channel hole 502. In some embodiments, the portion of sacrificial layer 504 that is not covered by protective structure 508 is selectively removed, e.g., using wet etching, to avoid damaging protective structure 508 and tunnel layer 326 underneath. The wet etchant for selectively removing the portion of sacrificial layer 504 can include any suitable wet etchant that has a relatively high selectivity (e.g., at least 20) between the material of sacrificial layer 504 and the material(s) of protective structure 508 and tunnel layer 326. In one example in which sacrificial layer 504 includes polysilicon, and each of protective structure 508 and tunnel layer 326 includes silicon oxide, a wet etchant including, but not limited to, tetramethylammonium hydroxide (TMAH) alkali hydroxide (e.g., potassium hydroxide (KOH) or sodium hydroxide (NaOH)), or ethylenediamine pyrocatechol (EDP), may be applied to selectively remove the portion of sacrificial layer 504 that is not covered by protective structure 508 without etching protective structure 508 and tunnel layer 326. That is, protective structure 508 can act as the etching mask to confine the wet etching only in the area that is not covered by protective structure 508, and tunnel layer 326 underneath can act as the etch stop layer to stop the wet etching when the exposed sacrificial layer 504 is removed. As shown in FIG. 5C, the remainder of sacrificial layer 504 covered by protective structure 508 (e.g., along the sidewall of channel hole 502) remains intact as it is protected by protective structure 508 during the wet etching.

It is understood that in some embodiments, a portion of sacrificial layer 504 at the bottom of channel hole 502 that is not covered by protective structure 508 may be removed by dry etching, such as RIE or any other suitable plasma-assisted dry etching processes. For example, due to the nature of dry etching, the etching rate, duration, and/or etching direction may be controlled to reduce the damage to protective structure 508 and tunnel layer 326 underneath when removing the portion of sacrificial layer 504 at the bottom of channel hole 502.

Method 400 proceeds to operation 410, as illustrated in FIG. 4A, in which a portion of the memory film at the bottom of the channel hole that is not covered by a remainder of the sacrificial layer is selectively removed (e.g., using wet etching). At least a portion of the semiconductor plug is exposed after the removal of the portion of the memory film at the bottom of the channel hole, according to some embodiments. In some embodiments as shown in FIG. 4B, a portion of the tunnel layer, a portion of the storage layer, and a portion of the block layer that are not covered by the remainder of the sacrificial layer are subsequently etched (e.g., using wet etching) in operation 428. The protective structure and at least one of the block, storage, and tunnel layers can include the same material, such that the protective structure and the at least one of the block, storage, and tunnel layers including the same material can be simultaneously wet etched. Different from the existing methods for forming channel structures in a 3D memory device, for example, as shown in FIG. 1, in which the memory film at the bottom of the channel hole is etched using dry etching, such as a plurality cycles of plasmas-assisted dry etching processes, wet etching can be used in method 400 to selectively remove each layer in the memory film at the bottom of the channel hole by applying suitable wet etchants each can be blocked by the corresponding etching mask and etch stop layer underneath. As a result, sidewall damage to the memory film and gouging into the semiconductor plug can be reduced, thereby increasing the product yield and improving the device performance.

Figure 5D:
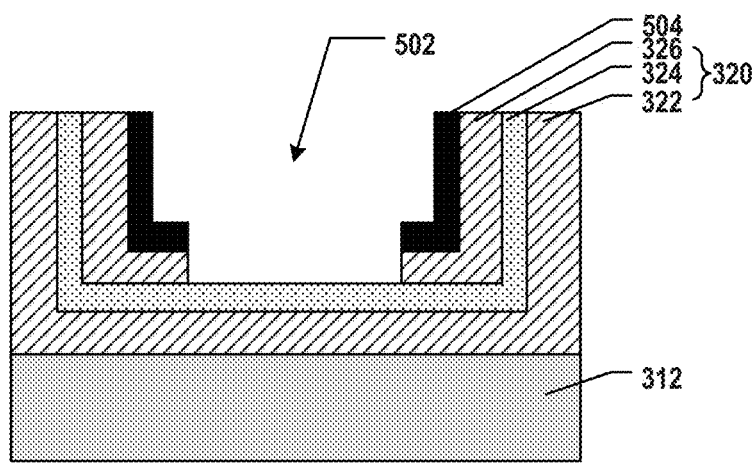

As illustrated in FIG. 5D, a portion of tunnel layer 326 at the bottom of channel hole 502 that is not covered by the remainder of sacrificial layer 504 is removed to expose a portion of storage layer 324 at the bottom of channel hole 502. In some embodiments, the portion of tunnel layer 326 that is not covered by the remainder of sacrificial layer 504 is selectively removed, e.g., using wet etching, to avoid damaging the remainder of sacrificial layer 504 and storage layer 324 underneath. The wet etchant for selectively removing the portion of tunnel layer 326 can include any suitable wet etchant that has a relatively high selectivity (e.g., at least 20) between the material of tunnel layer 326 and the material(s) of sacrificial layer 504 and storage layer 324. In one example in which tunnel layer 326 includes silicon oxide, sacrificial layer 504 includes polysilicon, and storage layer 324 includes silicon nitride, a wet etchant including, but not limited to, hydrofluoric acid (HF, e.g., buffered hydrofluoric acid (BHF)), may be applied to selectively remove the portion of tunnel layer 326 that is not covered by the remainder of sacrificial layer 504 without etching the remainder of sacrificial layer 504 and storage layer 324. That is, the remainder of sacrificial layer 504 can act as the etching mask to confine the wet etching only in the area that is not covered by the remainder of sacrificial layer 504, and storage layer 324 underneath can act as the etch stop layer to stop the wet etching when the exposed tunnel layer 326 is removed. As shown in FIG. 5D, the remainder of tunnel layer 326 covered by the remainder of sacrificial layer 504 (e.g., along the sidewall of channel hole 502) remains intact as it is protected by the remainder of sacrificial layer 504 during the wet etching.

In some embodiments in which protective structure 508 (shown in FIG. 5C) and tunnel layer 326 include the same material, such as silicon oxide, protective structure 508 is etched as well when etching the portion of tunnel layer 326 as described above. That is, protective structure 508 and the portion of tunnel layer 326 can be simultaneously removed by the same wet etching process to reduce an extra step of removing protective structure 508, thereby simplifying the fabrication process.

Figure 5E:
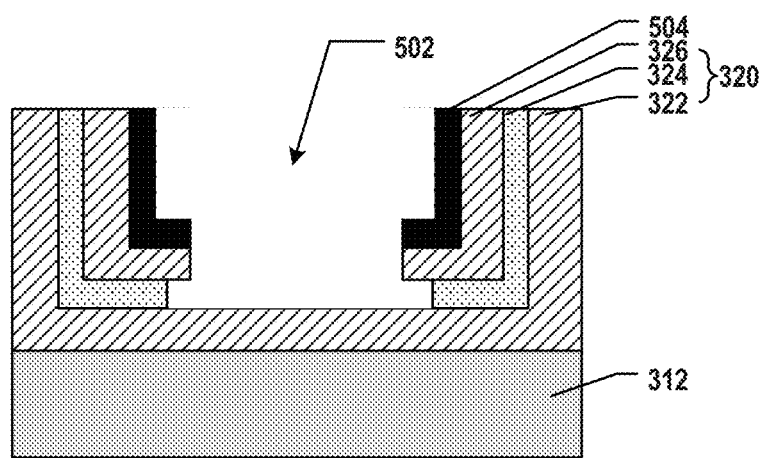

As illustrated in FIG. 5E, a portion of storage layer 324 at the bottom of channel hole 502 that is not covered by the remainder of sacrificial layer 504 is removed to expose a portion of block layer 322 at the bottom of channel hole 502. In some embodiments, the portion of storage layer 324 that is not covered by the remainder of tunnel layer 326 is selectively removed, e.g., using wet etching, to avoid damaging the remainder of sacrificial layer 504 and block layer 322 underneath. The wet etchant for selectively removing the portion of storage layer 324 can include any suitable wet etchant that has a relatively high selectivity (e.g., at least 20) between the material of storage layer 324 and the material(s) of sacrificial layer 504 and block layer 322. In one example in which storage layer 324 includes silicon nitride, sacrificial layer 504 includes polysilicon, and block layer 322 includes silicon oxide, a wet etchant including, but not limited to, phosphoric acid ($H_3PO_4$, e.g., hot orthophosphoric acid), may be applied to selectively remove the portion of storage layer 324 that is not covered by the remainder of sacrificial layer 504 without etching the remainder of sacrificial layer 504 and block layer 322. That is, the remainder of sacrificial layer 504 can act as the etching mask to confine the wet etching only in the area that is not covered by the remainder of sacrificial layer 504, and block layer 322 underneath can act as the etch stop layer to stop the wet etching when the exposed storage layer 324 is removed. As shown in FIG. 5E, the remainder of storage layer 324 covered by the remainder of sacrificial layer 504 (e.g., along the sidewall of channel hole 502) remains intact as it is protected by the remainder of sacrificial layer 504 during the wet etching.

Although not shown, it is understood that in some embodiments in which protective structure 508 and storage layer 324 include the same material, such as silicon nitride, protective structure 508 may be etched as well when etching the portion of storage layer 324 as described above. That is, protective structure 508 and the portion of storage layer 324 can be simultaneously removed by the same wet etching process to reduce an extra step of removing protective structure 508, thereby simplifying the fabrication process.

It is also understood that in case the wet etching process is isotropic, undercut may occur, for example, as shown in FIG. 5E. That is, a small portion of storage layer 324 covered by sacrificial layer 504 may still be etched during the wet etching process. For ease of description, any undercut due to isotropic wet etching is ignored in the present disclosure.

Figure 5F:
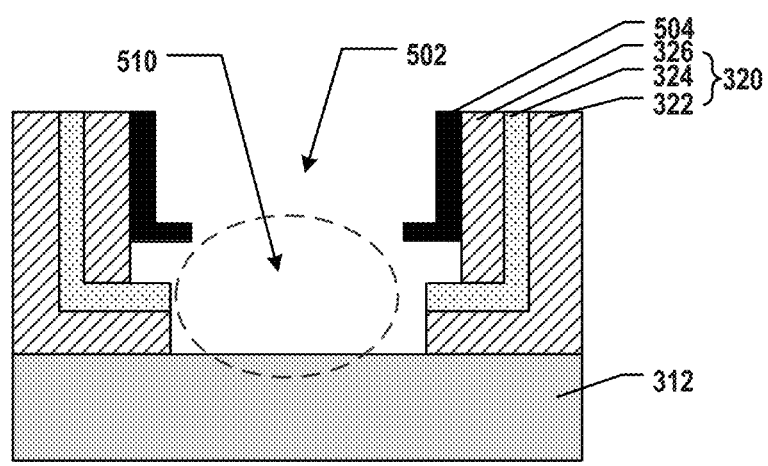

As illustrated in FIG. 5F, a portion of block layer 322 at the bottom of channel hole 502 that is not covered by the remainder of sacrificial layer 504 is removed to expose a portion of silicon plug 312. In some embodiments, the portion of block layer 322 that is not covered by the remainder of sacrificial layer 504 is selectively removed, e.g., using wet etching, to avoid damaging the remainder of sacrificial layer 504 and silicon plug 312 underneath. The wet etchant for selectively removing the portion of block layer 322 can include any suitable wet etchant that has a relatively high selectivity (e.g., at least 20) between the material of block layer 322 and the material(s) of sacrificial layer 504 and silicon plug 312. In one example in which block layer 322 includes silicon oxide and each of sacrificial layer 504 and silicon plug 312 includes silicon, a wet etchant including, but not limited to, hydrofluoric acid (e.g., BHF), may be applied to selectively remove the portion of block layer 322 that is not covered by the remainder of sacrificial layer 504 without etching the remainder of sacrificial layer 504 and silicon plug 312. That is, the remainder of sacrificial layer 504 can act as the etching mask to confine the wet etching only in the area that is not covered by the remainder of sacrificial layer 504, and silicon plug 312 underneath can act as the etch stop layer to stop the wet etching when the exposed block layer 322 is removed. As shown in FIG. 5F, the remainder of block layer 322 covered by the remainder of sacrificial layer 504 (e.g., along the sidewall of channel hole 502) remains intact as it is protected by the remainder of sacrificial layer 504 during the wet etching.

As a result, an opening 510 through memory film 320 (including block layer 322, storage layer 324, and tunnel layer 326) can be formed at the bottom of channel hole 502 to expose a portion of silicon plug 312, which achieves the same result as the "SONO" punched process using plasma-assisted dry etching processes, but with less damage to memory film 320 along the sidewall of channel hole and less gouging into silicon plug 312.

Figure 5G:
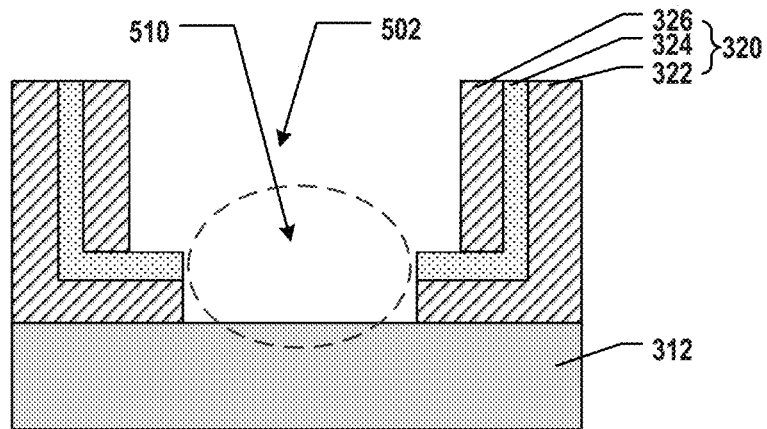

Method 400 proceeds to operation 412, as illustrated in FIG. 4A, in which the remainder of the sacrificial layer is removed to expose a remainder of the memory film (e.g., along the sidewall of channel hole 502). As illustrated in FIG. 5G, the remainder of sacrificial layer 504 (shown in FIG. 5F) is removed to expose the remainder of memory film 320. The remainder of sacrificial layer 504 can be removed using wet etching, for example, by applying a wet etchant including, but not limited to, TMAH, alkali hydroxide (e.g., KOH, NaOH), or EDP, to remove sacrificial layer 504 including polysilicon without damaging memory film 320.

Figure 5H:
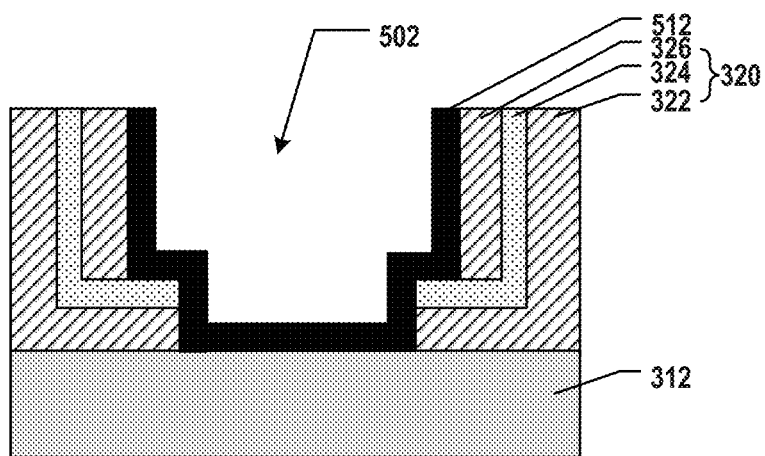

Method 400 proceeds to operation 414, as illustrated in FIG. 4A, in which a semiconductor channel is formed over the remainder of the memory film and in contact with the semiconductor plug. As illustrated in FIG. 5H, a semiconductor channel 512 is formed over the remainder of tunnel layer 326 of memory film 320 and in opening 510 (shown in FIG. 5G) as well to contact silicon plug 312. In some embodiments, semiconductor channel 512 is formed by depositing polysilicon using one or more thin film deposition processes, such as CVD, PVD, ALD, or any combination thereof. Semiconductor channel 512 can fully or partially fill opening 510 as long as it can be in contact with silicon plug 312. For example, semiconductor channel 512 can be deposited along the sidewall and bottom of opening 510 without completely filling opening 510.

As illustrated in FIG. 3F, a filling layer 334, such as a silicon oxide layer, is formed in lower and upper channel holes 310 and 318 (shown in FIG. 3E) to fully or partially fill the remaining space of lower and upper channel holes 310 and 318 using one or more thin film deposition processes, such as CVD, PVD, ALD, electroplating, electroless plating, or any combination thereof.

Figure 3G:
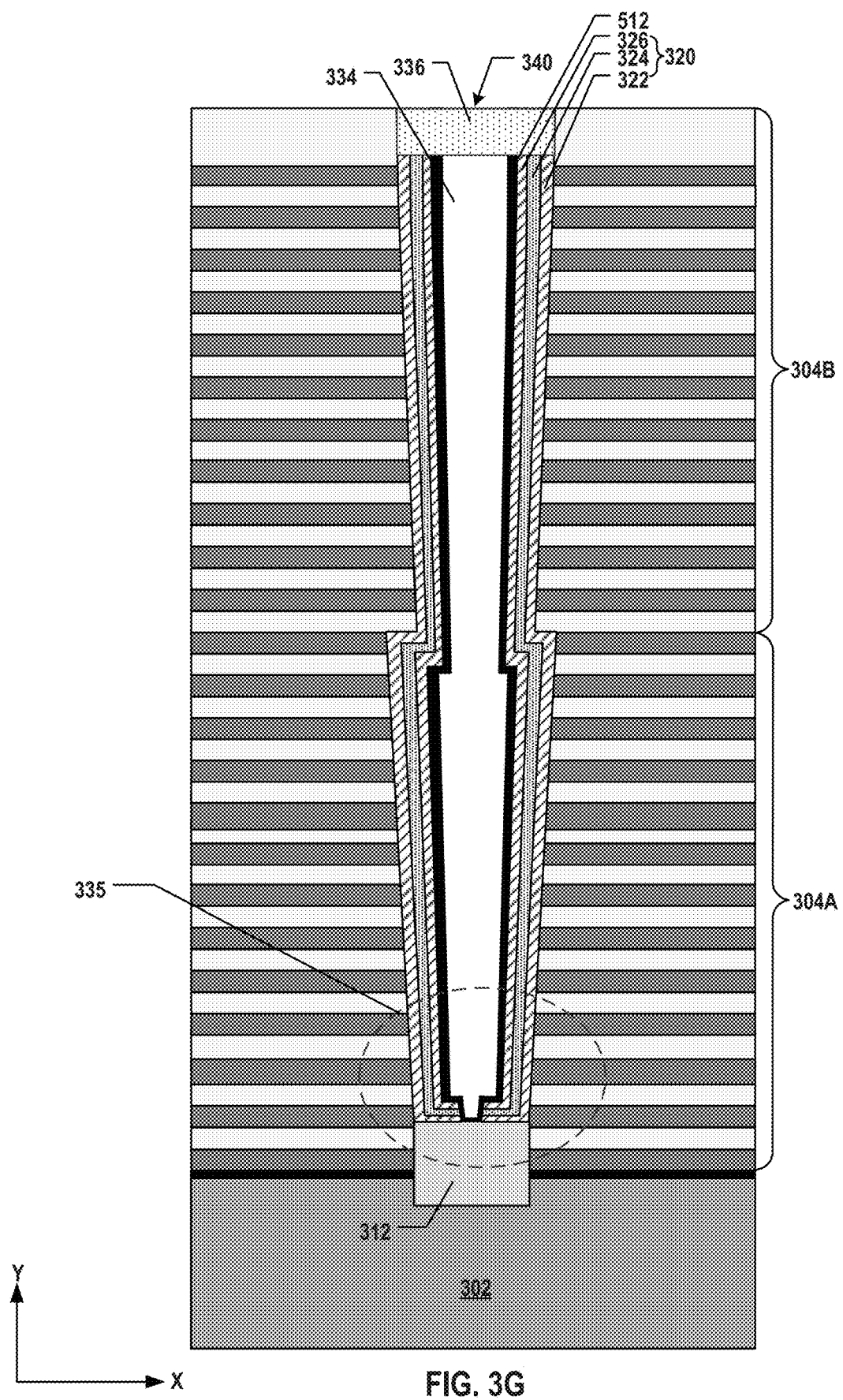

As illustrated in FIG. 3G, a channel plug 336 is formed in the upper portion of upper channel hole 318 (shown in FIG. 3E). In some embodiments, parts of memory film 320, semiconductor channel 512, and filling layer 334 that are on the top surface of upper dielectric deck 304B are removed and planarized by CMP, wet etching and/or dry etching. A recess then can be formed in the upper portion of upper channel hole 318 by wet etching and/or drying etching parts of memory film 320, semiconductor channel 512, and filling layer 334 in the upper portion of upper channel hole 318 (shown in FIG. 3E). Channel plug 336 then can be formed by depositing semiconductor materials, into the recess by one or more thin film deposition processes, such as CVD, PVD, ALD, or any combination thereof. A channel structure 340 is thereby formed, according to some embodiments.

Although not illustrated, it is understood that after the formation of channel structure 340, a dual-deck memory stack can be formed by replacing sacrificial layers 308 in lower and upper dielectric decks 304A and 304B with conductive layers (e.g., tungsten layers). The memory stack thus can include a plurality of conductive/dielectric layer pairs. In some embodiments, to form the memory stack, a slit opening (e.g., a gate line slit) can be formed through lower and upper dielectric decks 304A and 304B, sacrificial layers 308 in lower and upper dielectric decks 304A and 304B can be etched by applying the etchants through the slit opening to form a plurality of lateral recesses, and the conductive layers can be deposited in the lateral recesses.

According to one aspect of the present disclosure, a method for forming a 3D memory device is disclosed. A memory film and a sacrificial layer are subsequently formed along a sidewall and a bottom of a channel hole. A protective structure covering a portion of the sacrificial layer along the sidewall of the channel hole is formed. A portion of the sacrificial layer at the bottom of the channel hole that is not covered by the protective structure is selectively removed. A portion of the memory film at the bottom of the channel hole that is not covered by a remainder of the sacrificial layer is selectively removed.

In some embodiments, to form the protective structure, a protective layer is deposited over the sacrificial layer along the sidewall and the bottom of the channel hole, and a portion of the protective layer at the bottom of the channel hole is etched to form the protective structure. In some embodiments, the protective layer and the sacrificial layer include different materials. The protective layer can include a dielectric material.

In some embodiments, selectively removing the portion of the sacrificial layer includes wet etching.

In some embodiments, to subsequently form the memory film and the sacrificial layer, a block layer, a storage layer, and a tunnel layer are subsequently deposited along the sidewall and the bottom of the channel hole, and the sacrificial layer is deposited over the tunnel layer.

In some embodiments, the block layer includes silicon oxide, the storage layer includes silicon nitride, and the tunnel layer includes silicon oxide, and the sacrificial layer includes polysilicon.

In some embodiments, to selectively remove the portion of the memory film, a portion of the tunnel layer, a portion of the storage layer, and a portion of the block layer that are not covered by the remainder of the sacrificial layer are subsequently etched. In some embodiments, the etching includes wet etching.

In some embodiments, the protective structure and at least one of the block, storage, and tunnel layers include a same material, and the protective structure and the at least one of the block, storage, and tunnel layers including the same material are simultaneously etched.

In some embodiments, a semiconductor plug is formed at the bottom of the channel hole prior to the formation of the memory film. At least a portion of the semiconductor plug is exposed after the removal of the portion of the memory film at the bottom of the channel hole, according to some embodiments.

In some embodiments, the remainder of the sacrificial layer are removed to expose a remainder of the memory film after the removal of the portion of the memory film at the bottom of the channel hole, and a semiconductor channel is formed over the remainder of the memory film and in contact with the semiconductor plug.

According to another aspect of the present disclosure, a method for forming a 3D memory device is disclosed. A memory film and a sacrificial layer are subsequently formed along a sidewall and a bottom of a channel hole. A portion of the sacrificial layer at the bottom of the channel hole is removed to expose a portion of the memory film at the bottom of the channel hole. The portion of the memory film at the bottom of the channel hole that is not covered by a remainder of the sacrificial layer is wet etched.

In some embodiments, to subsequently form the memory film and the sacrificial layer, a block layer, a storage layer, and a tunnel layer are subsequently deposited along the sidewall and the bottom of the channel hole, and the sacrificial layer is deposited over the tunnel layer.

In some embodiments, the block layer includes silicon oxide, the storage layer includes silicon nitride, and the tunnel layer includes silicon oxide, and the sacrificial layer includes polysilicon.

In some embodiments, to wet etch the portion of the memory film, a portion of the tunnel layer, a portion of the storage layer, and a portion of the block layer that are not covered by the remainder of the sacrificial layer are subsequently wet etched.

In some embodiments, removing the portion of the sacrificial layer includes dry etching.

In some embodiments, a protective structure covering a portion of the sacrificial layer is formed along the sidewall of the channel hole prior to the removal the portion of the sacrificial layer at the bottom of the channel hole. Removing the portion of the sacrificial layer includes wet etching, according to some embodiments.

In some embodiments, to form the protective structure, a protective layer is deposited over the sacrificial layer along the sidewall and the bottom of the channel hole, and a portion of the protective layer at the bottom of the channel hole is dry etched to form the protective structure. In some embodiments, the protective layer and the sacrificial layer include different materials. The protective layer can include a dielectric material.

In some embodiments, a semiconductor plug is formed at the bottom of the channel hole prior to the formation of the memory film. At least a portion of the semiconductor plug is exposed after the removal of the portion of the memory film at the bottom of the channel hole, according to some embodiments.

In some embodiments, the remainder of the sacrificial layer is removed to expose a remainder of the memory film after the removal of the portion of the memory film at the bottom of the channel hole, and a semiconductor channel is formed over the remainder of the memory film and in contact with the semiconductor plug.

According to still another aspect of the present disclosure, a method for forming a 3D memory device is disclosed. A memory film and a sacrificial layer are subsequently formed along a sidewall and a bottom of a channel hole. A protective structure covering a portion of the sacrificial layer along the sidewall of the channel hole is formed. A portion of the sacrificial layer at the bottom of the channel hole that is not covered by the protective structure is wet etched. A portion of the memory film at the bottom of the channel hole that is not covered by a remainder of the sacrificial layer is wet etched.

In some embodiments, to form the protective structure, a protective layer is deposited over the sacrificial layer along the sidewall and the bottom of the channel hole, and a portion of the protective layer at the bottom of the channel hole is etched to form the protective structure. In some embodiments, the protective layer and the sacrificial layer include different materials. The protective layer can include a dielectric material.

In some embodiments, selectively removing the portion of the sacrificial layer includes wet etching.

In some embodiments, to subsequently form the memory film and the sacrificial layer, a block layer, a storage layer, and a tunnel layer are subsequently deposited along the sidewall and the bottom of the channel hole, and the sacrificial layer is deposited over the tunnel layer.

In some embodiments, the block layer includes silicon oxide, the storage layer includes silicon nitride, and the tunnel layer includes silicon oxide, and the sacrificial layer includes polysilicon.

In some embodiments, to wet etch the portion of the memory film, a portion of the tunnel layer, a portion of the storage layer, and a portion of the block layer that are not covered by the remainder of the sacrificial layer are subsequently wet etched.

In some embodiments, the protective structure and at least one of the block, storage, and tunnel layers include a same material, and the protective structure and the at least one of the block, storage, and tunnel layers including the same material are simultaneously wet etched.

In some embodiments, a semiconductor plug is formed at the bottom of the channel hole prior to the formation of the memory film. At least a portion of the semiconductor plug is exposed after the removal of the portion of the memory film at the bottom of the channel hole, according to some embodiments.

In some embodiments, the remainder of the sacrificial layer are removed to expose a remainder of the memory film after the removal of the portion of the memory film at the bottom of the channel hole, and a semiconductor channel is formed over the remainder of the memory film and in contact with the semiconductor plug.

According to yet another aspect of the present disclosure, a 3D memory device includes a substrate, a memory stack including interleaved conductive layers and dielectric layers above the substrate, and a channel structure extending vertically through the memory stack. The channel structure includes a semiconductor plug in a lower portion of the channel structure, a memory film above the semiconductor plug and along a sidewall of the channel structure, and a semiconductor channel over the memory film. A bottom of the semiconductor channel is above and in contact with the semiconductor plug.

In some embodiments, the memory film includes a block layer, a storage layer, and a tunnel layer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    subsequently forming a memory film and a sacrificial layer along a sidewall and a bottom of a channel hole;
    forming a protective structure covering a portion of the sacrificial layer along the sidewall of the channel hole;
    selectively removing a portion of the sacrificial layer at the bottom of the channel hole that is not covered by the protective structure; and
    selectively removing a portion of the memory film at the bottom of the channel hole that is not covered by a remainder of the sacrificial layer, comprising using the remainder of the sacrificial layer as a mask, removing a portion of a tunnel layer of the memory film at the bottom of the channel hole to expose a storage layer of the memory film.

2. The method of claim 1, wherein forming the protective structure comprises:
    depositing a protective layer over the sacrificial layer along the sidewall and the bottom of the channel hole; and
    etching a portion of the protective layer at the bottom of the channel hole to form the protective structure.

3. The method of claim 2, wherein the protective layer and the sacrificial layer comprise different materials.

4. The method of claim 3, wherein the protective layer comprises a dielectric material.

5. The method of claim 1, wherein selectively removing the portion of the sacrificial layer comprises wet etching.

6. The method of claim 1, wherein subsequently forming the memory film and the sacrificial layer comprises:
    subsequently depositing a block layer, the storage layer, and the tunnel layer along the sidewall and the bottom of the channel hole; and
    depositing the sacrificial layer over the tunnel layer.

7. The method of claim 6, wherein
    the block layer comprises silicon oxide, the storage layer comprises silicon nitride, and the tunnel layer comprises silicon oxide; and
    the sacrificial layer comprises polysilicon.

8. The method of claim 6, wherein selectively removing the portion of the memory film comprises subsequently etching the portion of the tunnel layer, a portion of the storage layer, and a portion of the block layer that are not covered by the remainder of the sacrificial layer.

9. The method of claim 8, wherein the etching comprises wet etching.

10. The method of claim 6, wherein:
    the protective structure and at least one of the block layer, the storage layer, or the tunnel layer comprise a same material; and
    the method comprises simultaneously etching the protective structure and the at least one of the block layer, the storage layer, or the tunnel layer comprising the same material.

11. The method of claim 1, further comprising forming a semiconductor plug at the bottom of the channel hole prior to forming the memory film, wherein at least a portion of the semiconductor plug is exposed after removing the portion of the memory film at the bottom of the channel hole.

12. The method of claim 11, further comprising:
removing the remainder of the sacrificial layer to expose a remainder of the memory film after the removal of the portion of the memory film at the bottom of the channel hole; and
forming a semiconductor channel over the remainder of the memory film and in contact with the semiconductor plug.

13. The method of claim 1, wherein selectively removing the portion of the memory film at the bottom of the channel hole further comprises, using the remainder of the sacrificial layer as the mask, removing a portion of the storage layer to expose a block layer.

14. The method of claim 1, wherein forming the protective structure comprises etching a portion of a protective layer at the bottom of the channel hole to form the protective structure covering an entire sidewall of the sacrificial layer.

15. A method for forming a three-dimensional (3D) memory device, comprising:
subsequently forming a memory film and a sacrificial layer along a sidewall and a bottom of a channel hole;
removing a portion of the sacrificial layer at the bottom of the channel hole to expose a first portion of the memory film at the bottom of the channel hole; and
wet etching the first portion of the memory film at the bottom of the channel hole by using a remainder of the sacrificial layer as an etching mask to expose a semiconductor plug, the remainder of the sacrificial layer comprising a first portion along the sidewall of the channel hole and a second portion remaining at the bottom of the channel hole,
wherein after the first portion of the memory film is removed, a second portion of the memory film at the bottom of the channel hole remains on the semiconductor plug.

16. The method of claim 15, wherein subsequently forming the memory film and the sacrificial layer comprises:
subsequently depositing a block layer, a storage layer, and a tunnel layer along the sidewall and the bottom of the channel hole; and
depositing the sacrificial layer over the tunnel layer.

17. The method of claim 16, wherein wet etching the first portion of the memory film comprises subsequently wet etching a portion of the tunnel layer, a portion of the storage layer, and a portion of the block layer by using the remainder of the sacrificial layer as the etching mask.

18. The method of claim 15, wherein wet etching the portion of the memory film at the bottom of the channel hole comprises using the remainder of the sacrificial layer as the etching mask, subsequentially wet etching a portion of a tunnel layer and a portion of a storage layer to expose a block layer.

19. A method for forming a three-dimensional (3D) memory device, comprising:
subsequently forming a memory film and a sacrificial layer along a sidewall and a bottom of a channel hole, the memory film comprising a tunnel layer, a storage layer, and a block layer;
forming a protective structure covering a portion of the sacrificial layer along the sidewall of the channel hole;
selectively removing a portion of the sacrificial layer at the bottom of the channel hole that is not covered by the protective structure, comprising etching the portion of the sacrificial layer by using the tunnel layer as an etch stop layer, a remainder of the sacrificial layer comprising a first portion along the sidewall of the channel hole and a second portion remaining at the bottom of the channel hole; and
selectively removing a portion of the memory film at the bottom of the channel hole that is not covered by a remainder of the sacrificial layer, wherein:
the protective structure and at least one of the block layer, the storage layer, or the tunnel layer comprise a same material; and
the method comprises simultaneously etching the protective structure and the at least one of the block layer, the storage layer, or the tunnel layer comprising the same material.

20. The method of claim 19, wherein selectively removing the portion of the memory film at the bottom of the channel hole, comprises:
removing a portion of the tunnel layer at the bottom of the channel hole by using the remainder of the sacrificial layer as a mask; and
removing a portion of the storage layer at the bottom of the channel hole by using the remainder of the sacrificial layer and a remainder of the tunnel layer as another mask.

* * * * *